United States Patent
Doyle et al.

(10) Patent No.: US 6,362,078 B1
(45) Date of Patent: Mar. 26, 2002

(54) DYNAMIC THRESHOLD VOLTAGE DEVICE AND METHODS FOR FABRICATING DYNAMIC THRESHOLD VOLTAGE DEVICES

(75) Inventors: Brian S. Doyle, Cupertino; Chunlin Liang, San Jose; Brian E. Roberds, Santa Clara, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/259,647

(22) Filed: Feb. 26, 1999

(51) Int. Cl.⁷ ............................................. H01L 21/30
(52) U.S. Cl. .................. 438/459; 438/197; 438/455; 257/728
(58) Field of Search .................. 438/197, 213, 438/455, 458, 459, 229, 257; 257/270, 278, 350, 365, 366, 728

(56) References Cited

U.S. PATENT DOCUMENTS 5,702,963 A  * 12/1997  Vu et al. ..................... 438/197
6,191,007 B1 *  2/2001  Matsui et al. ............... 438/459

* cited by examiner

*Primary Examiner*—Carl Whitehead, Jr.
*Assistant Examiner*—Jeff Vockrodt
(74) *Attorney, Agent, or Firm*—Blakely, Sokoloff, Taylor & Zafman LLP

(57) ABSTRACT

A method of making an active device is provided. A conductive line is formed in a substrate of a Metal-Oxide Semiconductor Field Effect Transistor (MOSFET). The conductive line runs alongside a gate of the MOSFET. The gate is coupled to the conductive line.

30 Claims, 10 Drawing Sheets

DYNAMIC THRESHOLD VOLTAGE DEVICE AND METHODS FOR FABRICATING DYNAMIC THRESHOLD VOLTAGE DEVICES

BACKGROUND OF THE INVENTION

(1) Field of the Invention

The present invention relates to the field of semiconductor devices fabrication. More specifically, the present invention relates to fabrication of dynamic threshold voltage devices (DTVD).

(2) Background Information

Dynamic threshold voltage devices (DTVD), include Metal Oxide Semiconductor Field Effect Transistors (MOSFET) configured to obtain higher drain-to-source currents for a same gate voltage. A DTVD is based on a MOSFET that has its body (substrate) debiased (charged). FIG. 1 schematically illustrates a cross-sectional view through a DTVD 100. DTVD 100 includes a gate 102, a source 104, a drain 106, the body 108 and a substrate 112 that may be a silicon substrate for example. The body 108 is separated from substrate 112 by an oxide film 110, as DTVD 100 is built according to Silicon-On-Insulator (SOI) technology. The gate 102 is electrically coupled to body 108 by way of conductor 105. As the potential applied to the gate raises, body 108 gets charged changing its potential and conducting more current. As the gate voltage increases, the body 108 slowly becomes debiased, such that the threshold voltage $V_T$ effectively decreases. The increase in the gate voltage and the decrease in the threshold voltage $V_T$ cause current $I_{DS}$ between drain and source, to increase, as $I_{DS}$ is proportional to $(V_{GS}-V_T)^2$, where $V_{GS}$ is the gate-source voltage.

At high frequency, when a signal is applied to a periphery 131 of gate 102, a certain amount of time τ is required to charge up the gate from periphery 131 of gate 102 to edge 130 thereof. As body 108 is not heavily doped it has a high resistance R. The high resistance R contributes to a high propagation delay RC through the body, where C represents the capacitance of the body. This delay may be an order of magnitude larger than the delay τ to the gate. The DTVD may practically be unusable at very high frequencies, because it takes the body a longer time to charge up than it takes the gate.

BRIEF DESCRIPTION OF THE DRAWINGS

The features, aspects, and advantages of the present invention will become more fully apparent from the following Detailed Description, appended claims, and accompanying drawings in which:

SUMMARY OF THE INVENTION

One embodiment of the present invention includes a method of making an active device. A conductive line is formed in a substrate of a Metal-Oxide Semiconductor Field Effect Transistor (MOSFET). The conductive line runs alongside a gate of the MOSFET. The gate is coupled to the conductive line.

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

One embodiment of the present invention includes a dynamic threshold voltage device (DTVD). The DTVD includes a conductive line formed in a substrate of a Metal Oxide Semiconductor Field Effect Transistor (MOSFET). The conductive line is aligned with and runs alongside a gate of the MOSFET. The gate is coupled to the conductive line. By having a conductive line coupled to and running alongside the gate of the MOSFET, the body is charged faster. The conductive line is ohmic enough for the body to follow a signal applied to the gate of the DTVD at desired high clock frequencies such as microprocessor frequencies, for example. By way of this arrangement the conductive line is charged at a substantially same time as the gate of the transistor once a signal is applied to the gate. The charging of the body of the transistor causes a decrease in the threshold voltage ($V_T$) of the MOSFET thereby resulting in a larger current between the drain and the source of the MOSFET. Therefore, the DTVD, according to one embodiment of the present invention has improved performance at higher frequencies.

Several methodologies for fabricating a conductive line (contact) of a DTVD are provided. In one embodiment, a first embodiment, of a process according to the present invention, at least one conductive line is formed onto a first semiconductor wafer. An embrittled film, adjacent to the at least one conductive line is formed in the first semiconductor wafer. A second semiconductor wafer is bonded to the at least one conductive line. A remaining portion of the first wafer is debonded from the embrittled film. At least one MOSFET transistor is formed onto the embrittled film. A gate of the MOSFET is aligned with and is coupled to the conductive line.

Figure 1:
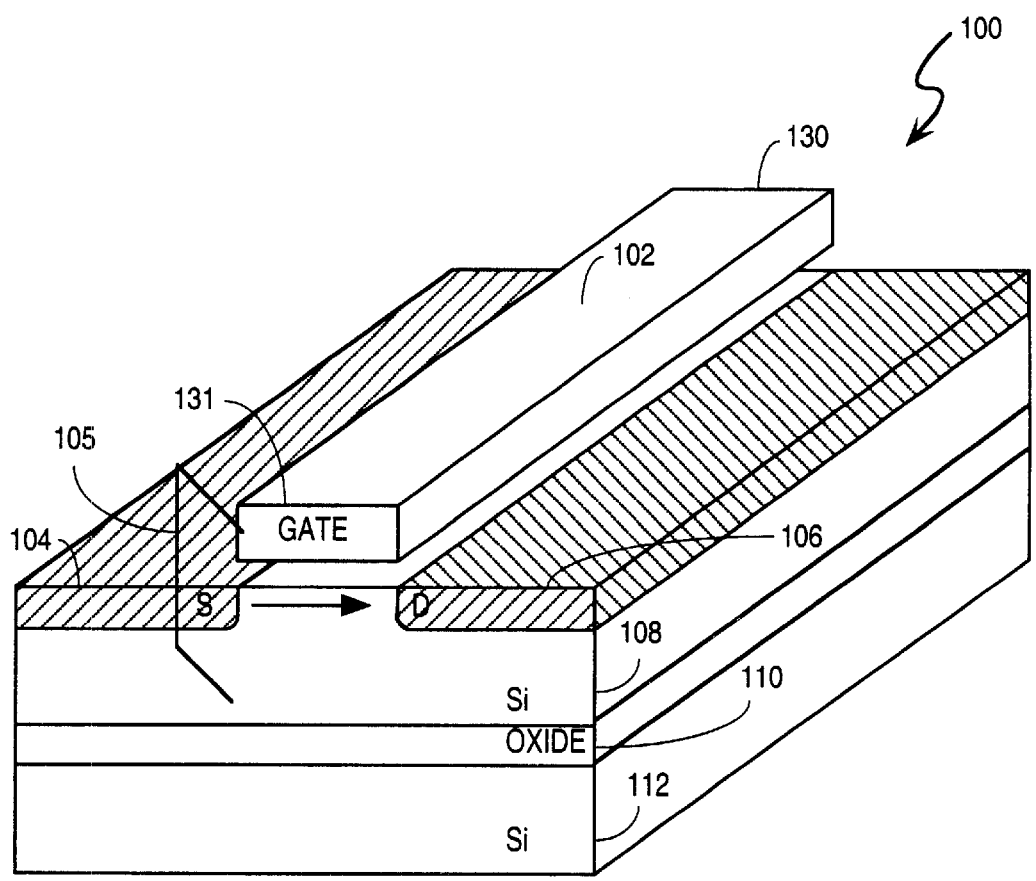
FIG. 1 illustrates a cross-sectional view through a dynamic threshold voltage device (DTVD)
Figure 2:
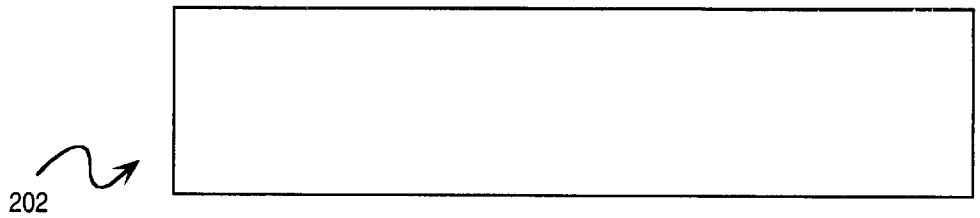
FIG. 2 illustrates a cross-sectional view through a first semiconductor wafer utilized in one embodiment of a process according to the invention.
Figure 3:
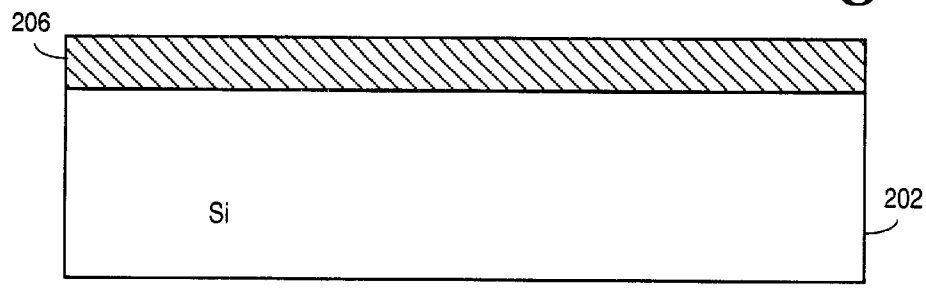
FIG. 3 illustrates a cross-sectional view through the first semi-conductor wafer of FIG. 2 where a conductive layer is formed on the first semiconductor wafer.

The first embodiment of the process of providing a DTVD according to the present invention starts with a first semiconductor wafer shown in FIG. 2. The semiconductor wafer 202 may be a silicon wafer, for example. A conductive layer 206, which may be polysilicon in one embodiment, is formed, typically by a process of deposition, on top of first semiconductor 202 as shown in FIG. 3. In the embodiment of the process according to the present invention described herein, polysilicon layer 206 is formed by a chemical vapor deposition (CVD) process, but the formation of polysilicon layer 206 is not limited in scope to this form of deposition.

Polysilicon layer 206 is then heavily doped by way of implantation for example, with either N+ or P+ impurities depending on the type of transistor desired to be fabricated. In one embodiment of the present invention, the impurities may include boron in a p-doped substrate and phosphorus or arsenic in an n-doped substrate. The concentration of the impurities may be approximately $10^{20}/cm^2$. Note that instead of heavily doped polysilicon layer 206, one may deposit a layer of conductive material that may withstand high temperature processing such as metal and its compounds, silicide, nitride, etc. When a metal is used for layer 206, the first semiconductor wafer 202 is first implant-doped with a high concentration N+ impurities for a desired PMOSFET device and with a high concentration P+ for a desired NMOSFET. Therefore, the metal contact of layer 206 to silicon wafer 202 is ohmic, and thus does not suffer a drop in potential. Next, layer 206 is patterned using a gate mask (not shown) substantially identical to that of the MOSFET structure to be fabricated.

After patterning, the first semiconductor wafer 202 is subjected to a well-known process of photolithography where undesired portions of layer 206 may be etched by way of a bromine-based dry etchant, for example. After etching, a structure is obtained, such as the one illustrated in FIG. 4, with conductive lines 210 separated by spaces in desired portions of layer 206. Each of the conductive lines 210 may later run alongside and may be aligned with a gate of the DTVD to be fabricated.

Figure 4:
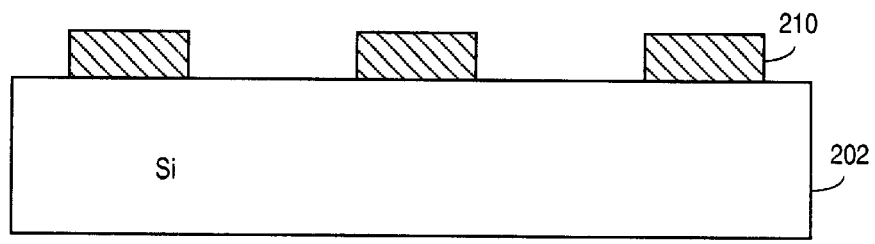
FIG. 4 illustrates a cross-sectional view through the structure of FIG. 3 after this structure has been patterned and etched to form conductive lines.
Figure 5:
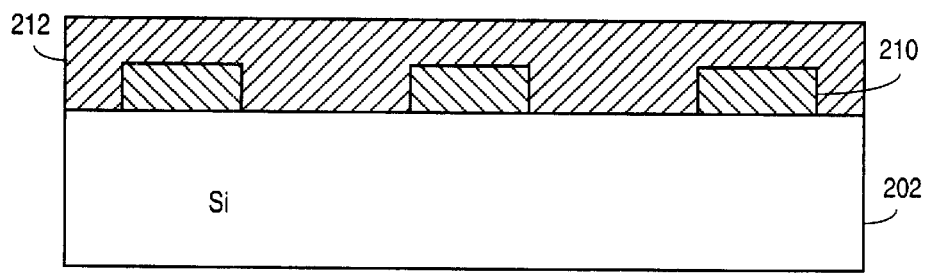
FIG. 5 illustrates a cross-sectional view through the structure of FIG. 4 after an isolation layer is deposited thereupon.

Next, an isolation layer is deposited upon the structure of FIG. 4, as illustrated in FIG. 5. Isolation layer 212 may include an oxide material deposited by a CVD process, for example. Isolation layer 212 may be planarized by a process of chemical mechanical polishing (CMP), for example.

Figure 6:
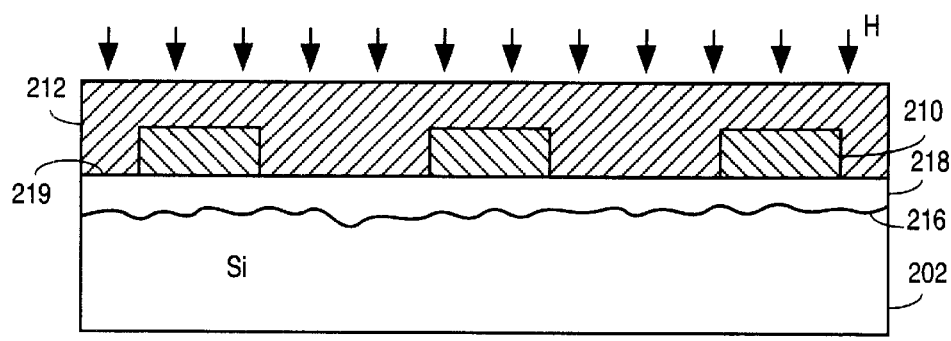
FIG. 6 illustrates a cross-sectional view through the structure of FIG. 5 that is subjected to a process of ion implantation according to an embodiment of the process of the present invention.

FIG. 6 illustrates the structure of FIG. 5 subjected to a process of ion implantation to create an embrittled layer 218 at a top part of the first silicon wafer 202. The embrittled layer 218 is adjacent to conductive lines 210. The embrittled layer 218 is defined by a damaged surface 216, caused by the ion implantation, and by top surface 219 of the first semiconductor wafer 202.

According to the implantation process, hydrogen ions, for example, at a density approximately ranging between $5 \times 10^{16}/cm^2$ and $10^{17}/cm^2$ are implanted in the top part of the first silicon wafer 202. In one embodiment according to the present invention, the embrittled film 218 has a thickness approximately equal to 0.2 micrometers and the oxide layer 212 has a thickness approximately equal to 0.8 micrometers, but the present invention is not limited in scope to these thickness values. The process of hydrogen implantation and generation of an embrittled film is part of a method called SMARTCUT which is well known in the art.

Figure 7:
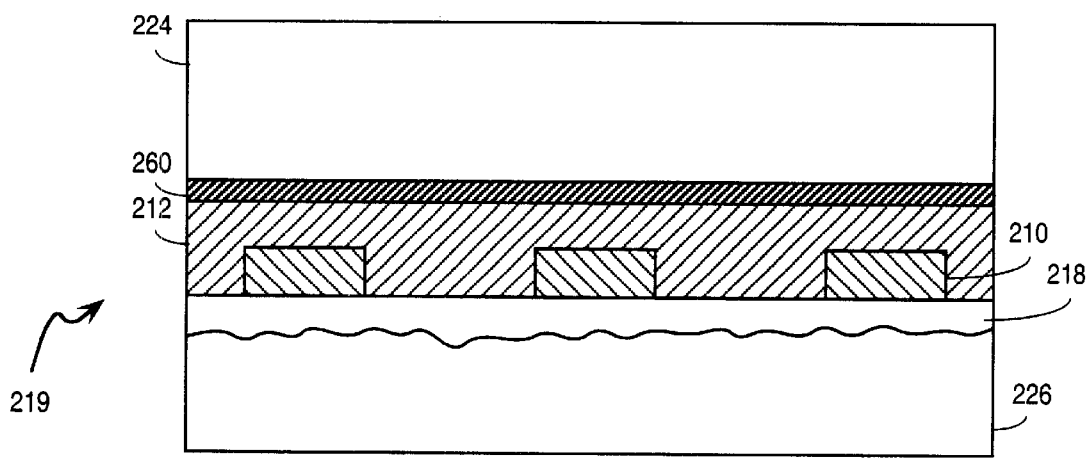
FIG. 7 illustrates a cross-sectional view through the structure of FIG. 6 that has a second wafer placed thereon according to an embodiment of the process of the present invention.
Figure 8:
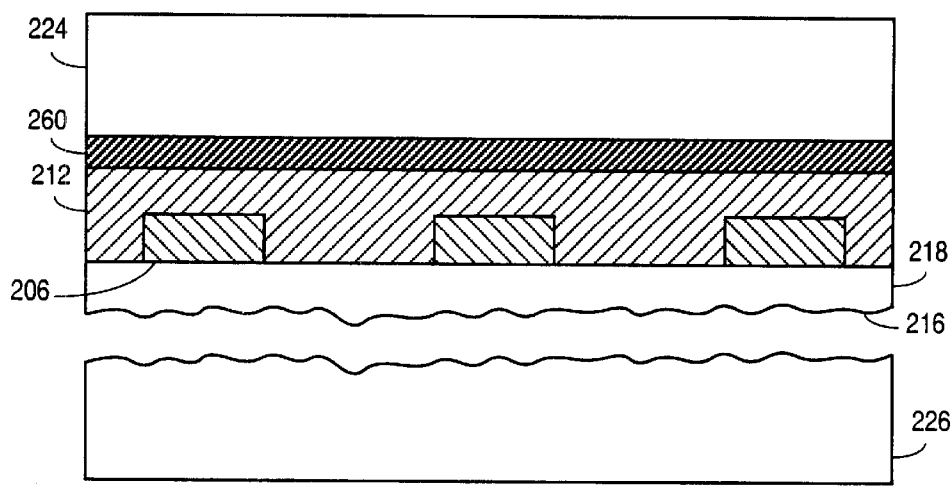
FIG. 8 illustrates a cross-sectional view through the structure of FIG. 7 after an embrittled region is split off from the rest of the first semiconductor wafer according to one embodiment of the process of the present invention.

Next, the structure of FIG. 6 is placed in contact with a second wafer 224 that has a thin oxide film 260 formed thereon as shown in FIG. 7. Oxide film 260 may have a thickness in a range of 0.1 to 0.4 micrometers. The second wafer 224 is placed with oxide film 260 on top of isolation layer 212 of the first wafer. Then the ensemble 219 of the two wafers with the embrittled film 218, conductive lines 210, isolation layer 212 and oxide layer 260 is heated. When the temperature at which the ensemble 219 is heated reaches approximately 400° C., a remaining portion 226 of first the wafer splits off (is debonded) transferring the thin films 218 and 212 to the second wafer 224 that has oxide film 260 formed thereon as illustrated in FIG. 8.

The ensemble is then further heated to a temperature of 800° C. to cause strong adhesion (bonding) between the isolation layer 212 of the first wafer and the oxide film 260 of the second wafer 224. The thin oxide 260 film, deposited on second wafer 224, facilitates bonding of second wafer 224 to insulation layer 212.

Figure 9:
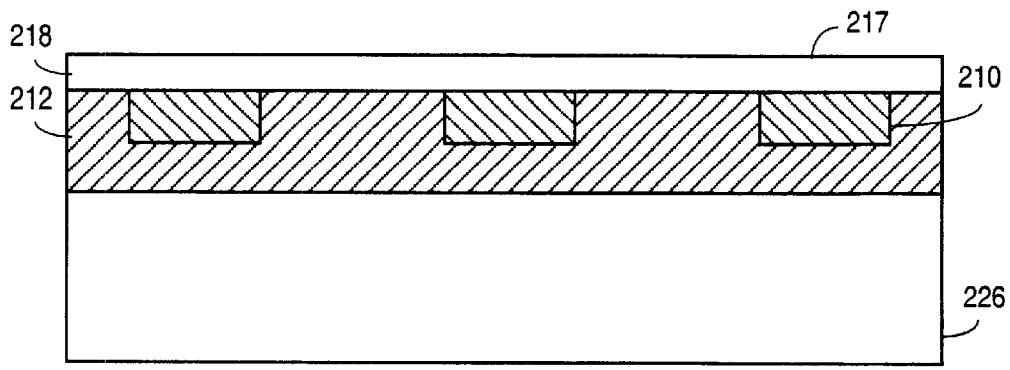
FIG. 9 illustrates a cross-sectional view through the structure of FIG. 8 after a remaining portion of the first substrate is removed according to one embodiment of the process of the present invention.
Figure 10:
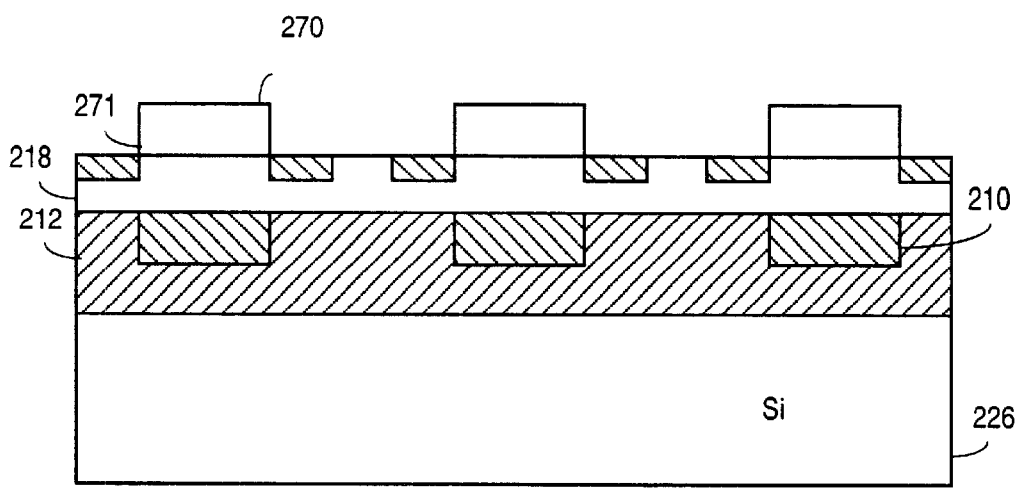
FIG. 10 illustrates a cross-sectional view through the structure of FIG. 9 after MOSFET devices are built onto the first film of the structure of FIG. 9.

The ensemble of the second wafer 224 with the rest of the structures bonded thereto are then turned upside down as illustrated in FIG. 9. The damaged area 216 of embrittled film 218 is then subjected to a process of CMP which planarizes it to form top surface 217. Next MOSFETs 271, illustrated in FIG. 10, are built according to processes well known in the art. Gates 270 are aligned with conductive line 210. Conductive lines 210 run beneath and alongside gates 271.

Figure 11:
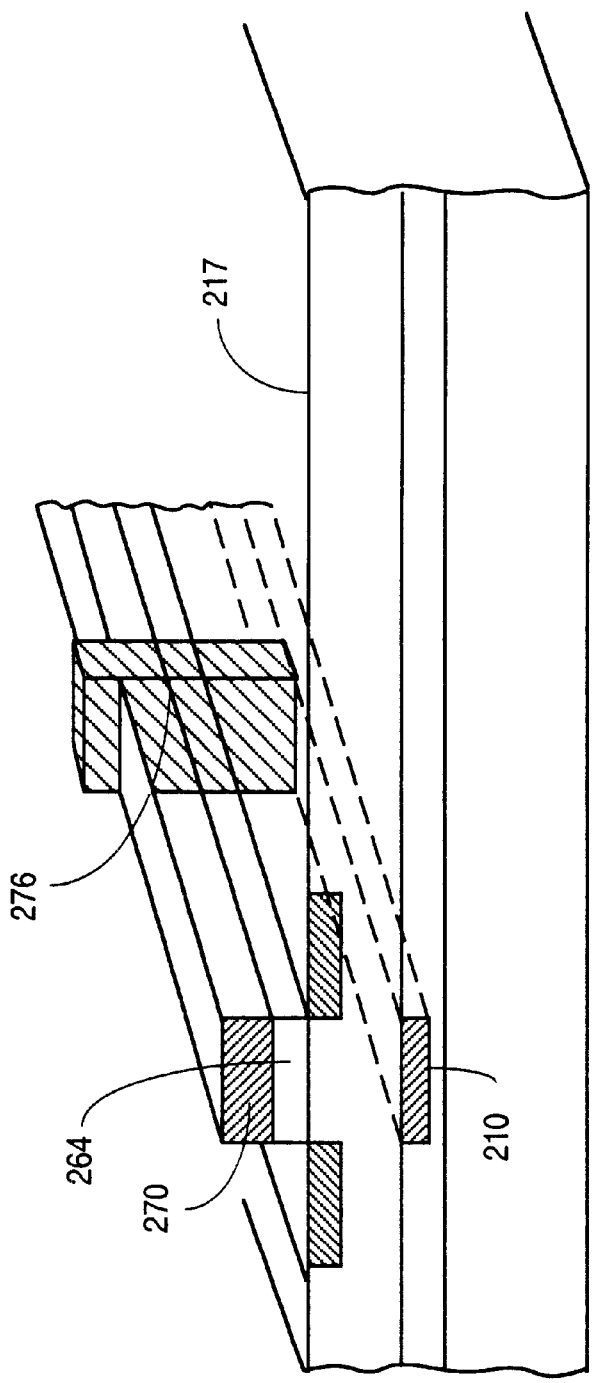
FIG. 11 illustrates a 3-dimensional view through the structure of FIG. 10.

FIG. 11 illustrates a 3-dimensional view of the structure of FIG. 10. Note that gate 270 is aligned with the conductive line 210 that runs beneath and alongside gate 270. To link up gate 270 with conductive line 210 to form the DTVD, a via contact 276 may be formed between the two. By electrically coupling gate 270 to the buried conductive line 210, the resistance of the body becomes ohmic. Since gate 270 and conductive line 210 have approximately the same electrical resistance, the signal propagates through the gate and through the body at a substantially same speed. This allows for quasi-instantaneous charging of the body. As the body charges at a substantially same time as the gate, the DTVD, obtained by way of the embodiment of the process of the present invention described herein, may be utilized at high frequencies.

In FIG. 11 it is shown that via contact 276, that couples the conductive line 210 to gate 270, is made through oxide isolation 264 that exists between top surface 217 and the gate 270. The width of via contact 276 is approximately equal to a width of gate 270. Via contact 276 may be formed in any of the following manners. For example, via contact 276 may be formed prior to the formation of the buried polysilicon/metal lines 210.

Figure 12:
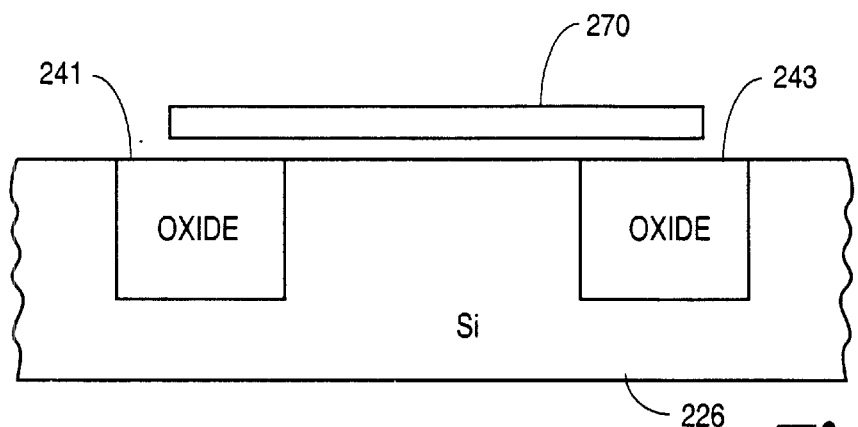
FIG. 12 illustrates a side view through a semiconductor substrate with oxide insulation trenches and a gate.
Figure 13:
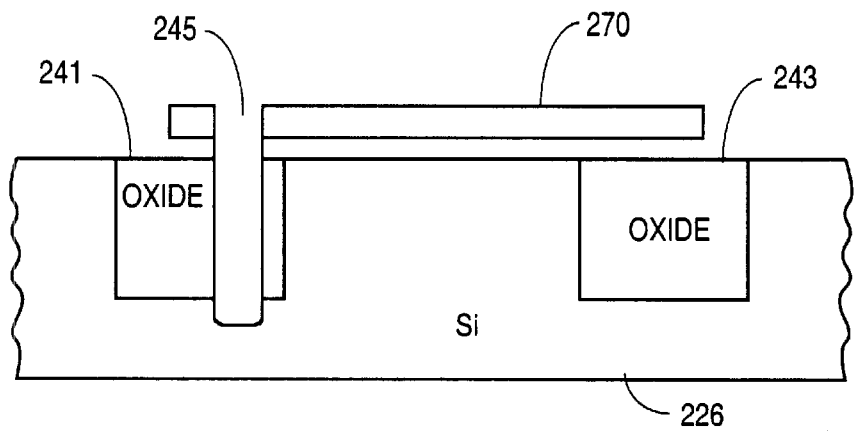
FIG. 13 illustrates the structure of FIG. 12 where a via hole is formed through the gate, through the oxide insulation trench and beyond the oxide insulation trench.
Figure 14:
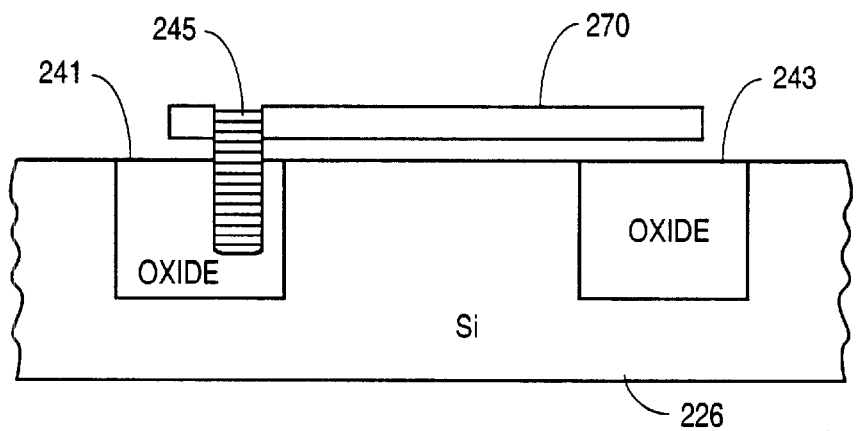
FIG. 14 illustrates the structure of FIG. 13 where the via hole is filled with a selectively etchable material.
Figure 15:
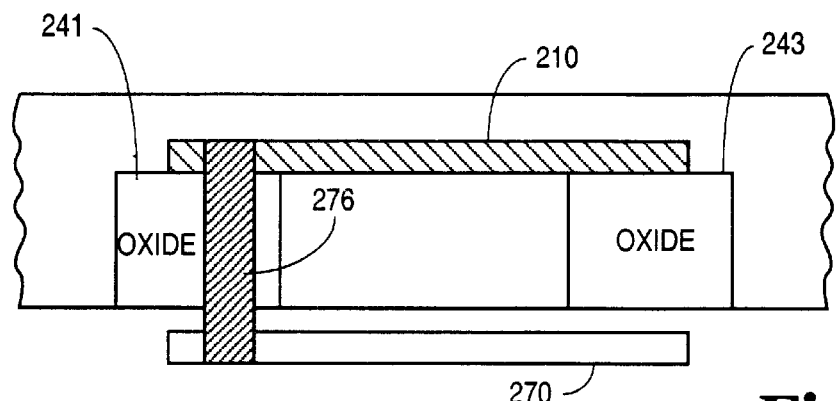
FIG. 15 illustrates the structure of FIG. 14 where a conductive line is formed in the substrate.

FIG. 12 illustrates a semiconductor substrate 226 with oxide insulation trenches 241 and 243. A polysilicon gate 270 is formed on top of substrate 226. FIG. 13 illustrates the structure of FIG. 12 where a via hole 245 is formed by etching through the gate 270, through the oxide insulation trench 241 and beyond the oxide insulation trench 241. The via hole 245 is filled with a selectively etchable material as illustrated in FIG. 14 until the full transistor has been constructed. The selectively etchable material may be nitride by way of example. FIG. 15 illustrates the structure of FIG. 14, turned upside down, with a conductive line 210 formed by way of the process explained earlier in this description. Then the selectively etchable material is removed by etching and the via hole is filled with a conductive material such as tungsten, for example to form via contact 276. The via contact 276 may extend beyond the future split-off boundary.

Figure 16:
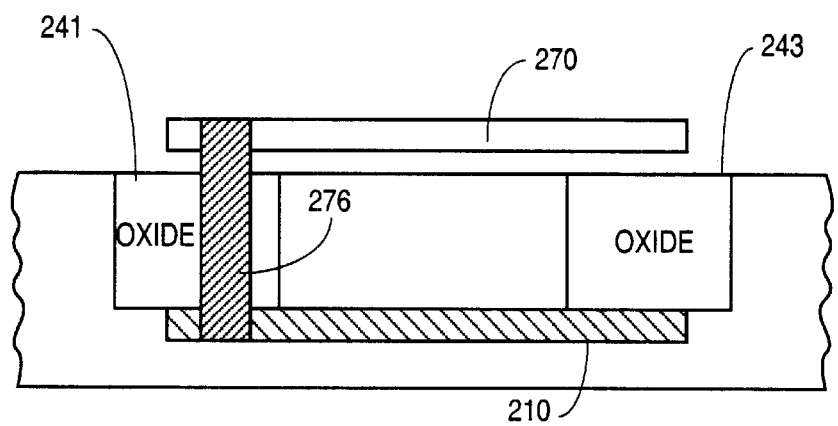
FIG. 16 illustrates a structure with a gate and a conductive line buried into the substrate where a via contact is formed after the formation of the gate and of the buried conductive line.
Figure 17:
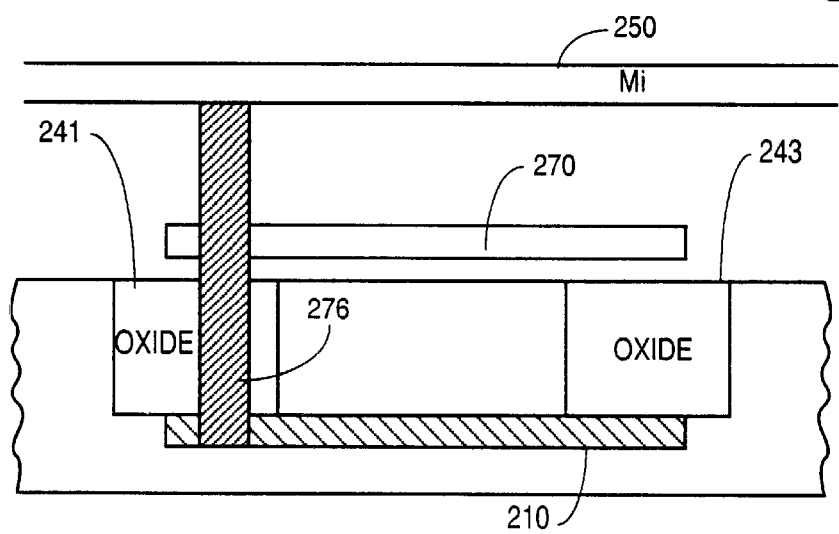
FIG. 17 illustrates an embodiment where a via contact is formed during an M1-to-poly-gate contact step.

A via contact may also be formed after the formation of the polysilicon gate 270 and of conductive line 210 as illustrated in FIG. 16. A tungsten via contact 276 may be used so a stacked contact may be formed between the contact between the polysilicon gate and buried polysilicon/metal structure and the contact between the polysilicon gate and the Metal1 (M1) layer (not shown). Moreover, the contact may be formed during the traditional M1-to-poly-gate contact step, as illustrated in FIG. 17, by extending the contact hole further into the substrate to make contact with the buried contact.

Figure 18:
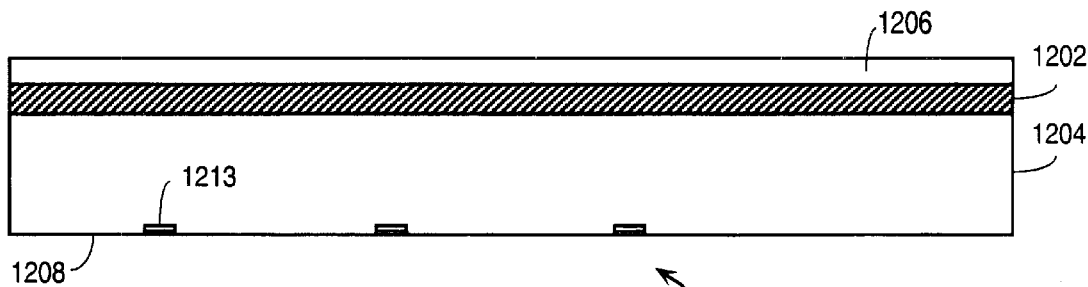
FIG. 18 illustrates a silicon-on-insulator (SOI) wafer.

A second embodiment of the present invention includes an alternative process for fabricating a DTVD. The process starts off with the Silicon-On-Insulator (SOI) wafer 1200 illustrated in FIG. 18. The SOI wafer 1200 includes a oxide layer 1202 buried into a substrate 1204. The SOI wafer also includes a semiconductor film 1206. The buried oxide layer 1202 separates between substrate 1204 and film 1206.

Figure 19:
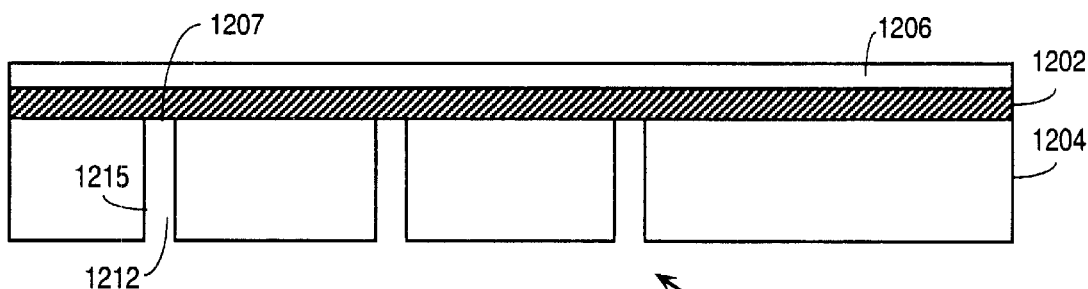
FIG. 19 illustrates an SOI wafer with a plurality of trenches made at a backside of the wafer.

A mask (not shown) is then formed on a backside surface 1208 of substrate 1204. A photolithography process then follows to define areas 1213. The mask used is substantially identical to the inverse gate mask corresponding to the gate of the MOSFET that is later formed at the topside of substrate 1204 where semiconductor film 1206 is located. Trenches 1212 are made through substrate 1204 as illustrated in FIG. 19. Trenches 1212 are obtained by performing an etching process. The buried oxide layer 1202 acts as an etch stop layer. One etching process that may be utilized for etching the trenches is one using a sacrificial oxide or screen oxide. This process allows for the etching of trenches through the silicon wafer with virtually infinite aspect ratios, i.e. ratio of height of trench to width of trench. The trenches extend through the thickness of the silicon wafer and have a depth of approximately 800 micrometers, but the present invention is not limited in scope to this value. The trenches stop at the oxide layer 1202.

Figure 20:
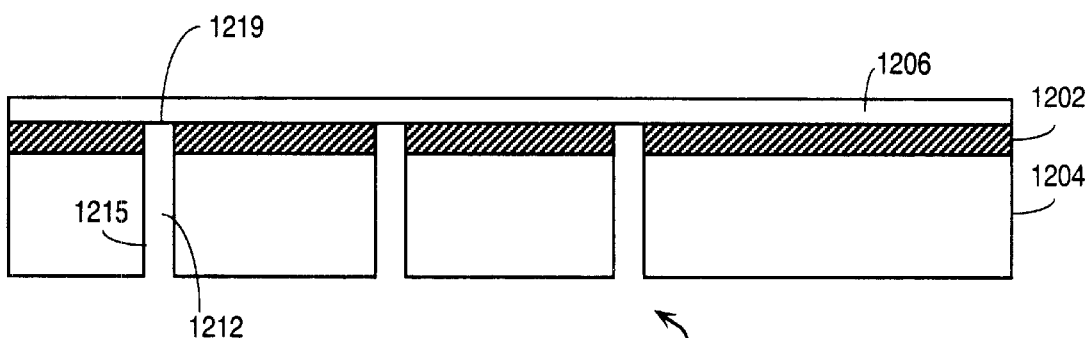
FIG. 20 illustrates a cross-sectional view through the wafer of FIG. 19 where trenches are further etched through and oxide layer.

Next, oxide portions 1207, of oxide layer 1206, defined by sidewalls 1215, are removed by any etchant suitable for oxide and the structure of FIG. 20 is obtained. By removing the oxide portions 1207 of FIG. 13, the passage is cleared all the way to portions 1219 where a conductive lines may be formed.

Figure 21:
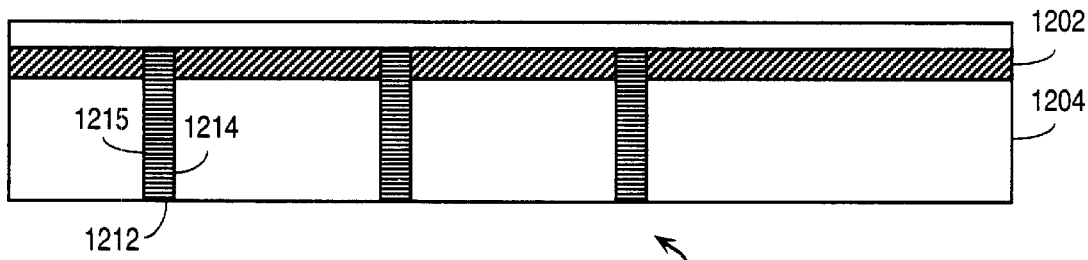
FIG. 21 illustrates a cross-sectional view through the wafer of FIG. 20 where the trenches are filled.

Next, as illustrated in FIG. 21, trenches 1212 may be filled all the way with a removable material 1214, such as silicon nitride to avoid obstruction of the trenches during further process.

Figure 22:
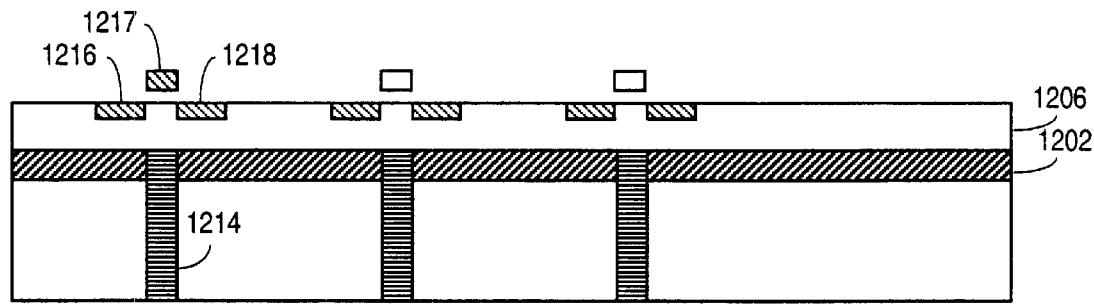
FIG. 22 illustrates a cross-sectional view through the substrate of FIG. 21 where MOSFETs are formed with a gate thereof aligned with the trenches formed in the substrate.

The process then continues with formation, onto film 1206, of a plurality of MOSFETs by way of a conventional process of forming MOSFETs as illustrated in FIG. 22. Active regions 1216 and 1218 are formed onto film 1206, while gates 1217 are formed on the film 1206 after a layer of insulating material such as oxide, has been deposited on film 1206. The transistors fabricated onto layer 1206 have their gates 1217 aligned with the respective trenches.

Figure 23:
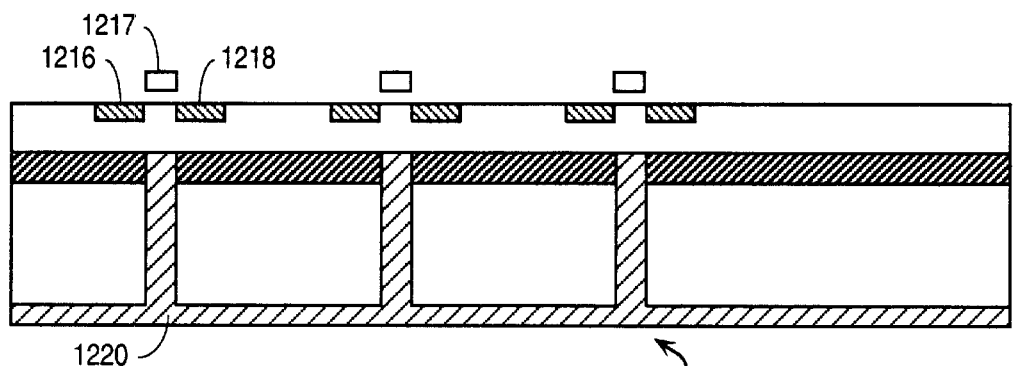
FIG. 23 illustrates the cross-sectional view through the wafer of FIG. 22 where the trench filling material is etched and a conductive material is deposited into the trenches.

Next, the trench filling material 1214 is removed exposing the backside of the transistors. In one embodiment, a hot phosphoric material may be used to etch away the silicon nitride. Next, as illustrated in FIG. 23, a conductive material 1219 is deposited into trenches 1212 by way of a CVD process, for example. In one embodiment according to the present invention, the conductive material includes a metal. The metal may be nickel or titanium or cobalt, or any other material that may be used for obtaining a silicide. The metal is typically sputtered.

Figure 24:
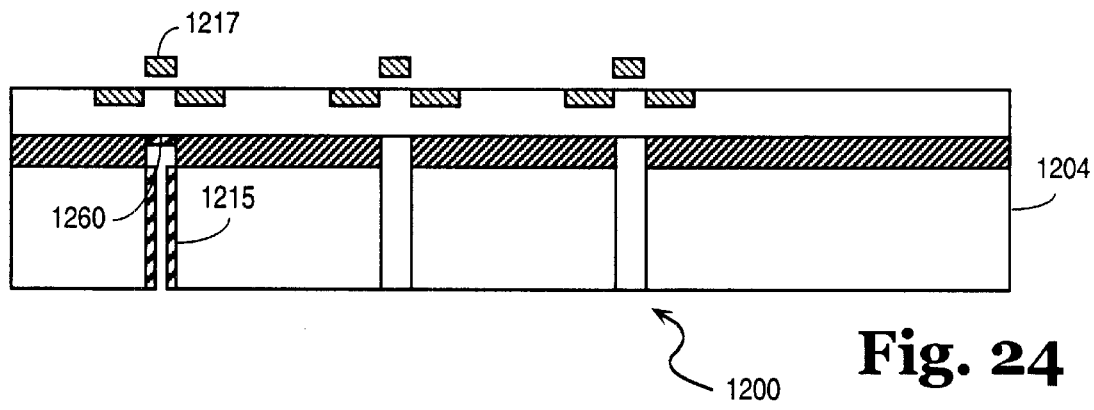
FIG. 24 illustrates a cross-sectional view through the wafer of FIG. 23 after a process of annealing that results in combination of the metal of the trenches with the silicon of the substrate to form silicide.
Figure 25:
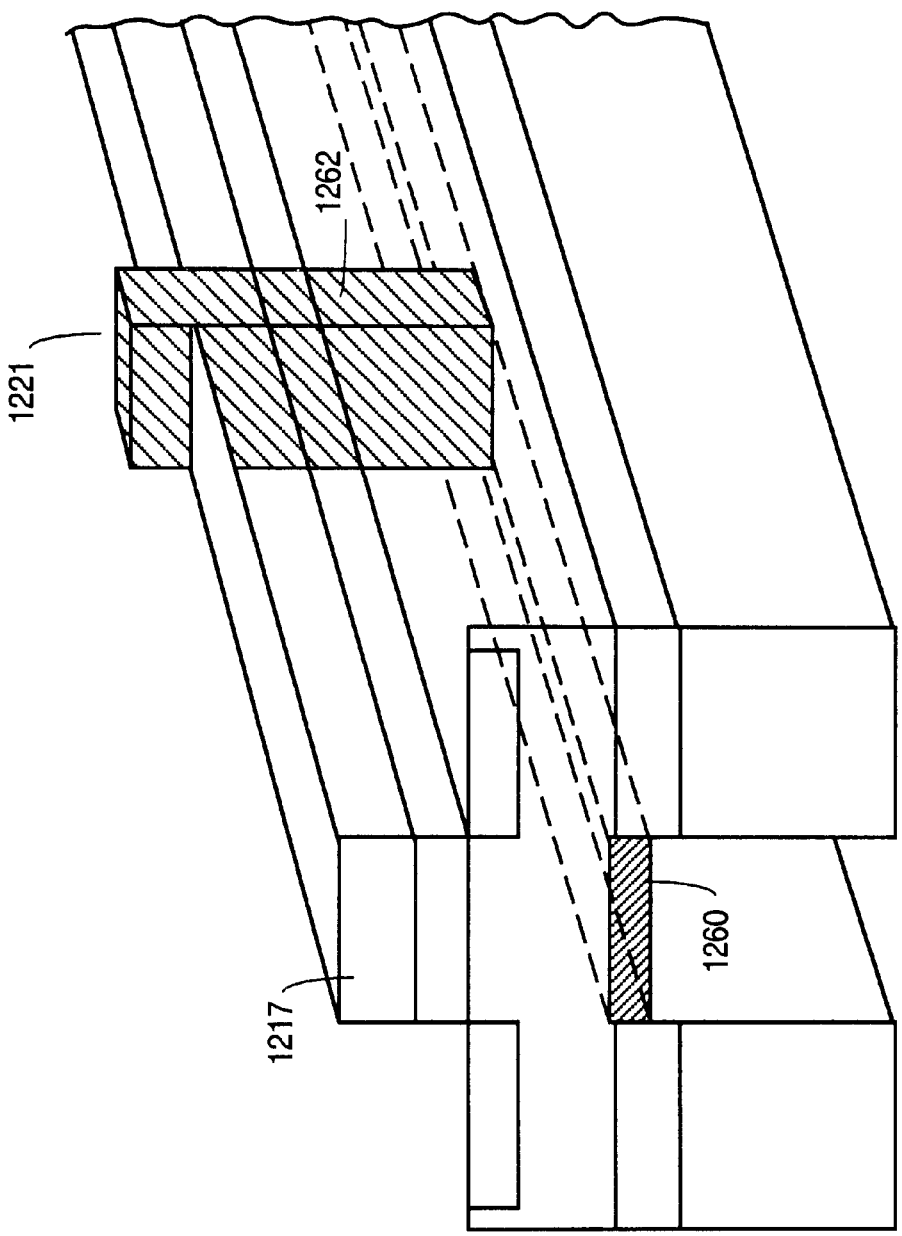
FIG. 25 illustrates a cross-sectional view through the wafer of FIG. 24 where a conductive line is coupled to a gate.

Next, an annealing process follows. The annealing process takes place at a temperature that is in a range of approximately 400°–800° C. As a result of the annealing process, the deposited metal combines with the silicon material of the sidewalls 1215 thereby forming a silicide as illustrated in FIG. 24. Next the metal that has not reacted with the silicon is etched away by way of a wet etch process leaving a pattern of silicide 1260 isolated from the substrate 1204. The portion of silicide 1260, at the back of the trench, runs parallel alongside gate 212 as shown in FIG. 25. A contact 1262 is coupled between gate 1212 and the conductive line 1260. The conductive line 1260 has substantially the same conductivity as the conductivity of gate 1217. In this way, due to the conductive line 1260, coupled to gate 1212, the body may charge at a substantially same speed as the gate.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited by the appended claims.

What is claimed is:

1. A method of making an active device, the method comprising:

forming a conductive line in a semiconductor substrate of a Metal Oxide Semiconductor Field Effect Transistor (MOSFET), a source region and a drain region of said MOSFET being disposed in said semiconductor substrate, said conductive line being aligned with a gate of said MOSFET; and forming an electrical connection that couples said gate to said conductive line.

2. The method of claim 1, said forming of a conductive line in a substrate of a MOSFET includes forming at least one conductive line onto a first semiconductor wafer.

3. The method of claim 2, said forming of a conductive line in a substrate of a MOSFET further includes forming a first isolation layer onto said at least one conductive line.

4. The method of claim 3, said forming of a conductive line in a substrate of a MOSFET further includes forming in said first semiconductor wafer an embrittled film adjacent said at least one conductive line and said first isolation layer.

5. The method of claim 4, said forming of a conductive line in a substrate of a MOSFET further includes bonding a second semiconductor wafer to said first isolation layer.

6. The method of claim 5, said forming of a conductive line in a substrate of a MOSFET further includes debonding a remaining portion of said first wafer from said embrittled film.

7. The method of claim 5, said forming of a conductive line in a substrate of a MOSFET further includes forming at least one MOSFET transistor onto the embrittled film, a gate of the MOSFET aligned with and coupled to the conductive line.

8. A method of making an active device, the method comprising:

forming at least one conductive line onto a first semiconductor wafer;

forming, in said first semiconductor wafer, an embrittled film in contact with said at least one conductive line;

bonding a second semiconductor wafer over said at least on conductive line;

debonding a remaining portion of said first wafer from said embrittled film; and, forming at least one Metal Oxide Semiconductor Field Effect Transistor (MOSFET) having a source region and a drain region disposed in said embrittled film, a gate of said MOSFET being aligned with and coupled to said at least one conductive line.

9. The method of claim 8, wherein said at least one conductive line includes heavily doped polysilicon.

10. The method of claim 8, wherein said at least one conductive line is formed by forming a conductive layer onto said first semiconductor wafer; and patterning said conductive layer.

11. The method of claim 8, said embrittled film is formed by implanting ions into said first semiconductor wafer.

12. The method of claim 11, said ions include hydrogen ions.

13. The method of claim 8 further including forming an isolation layer by depositing oxide on the at least one conductive line and planarizing said oxide.

14. The method of claim 8, said oxide has a thickness of approximately 0.8 μm.

15. The method of claim 14, said embrittled film has thickness of approximately 0.2 μm.

16. A method of making an active device, the method comprising:

forming at least one conductive line onto a first semiconductor wafer;

forming in said first semiconductor wafer an embrittled film connected with said at least one conductive line;

transferring said embrittled film with said at least one conductive line to a second semiconductor wafer; and forming at least one Metal Oxide Semiconductor Field Effect Transistor (MOSFET) having a source region and a drain region disposed in said embrittled film, a gate of said MOSFET being aligned with and coupled to said at least one conductive line.

17. A method of making an active device, the method comprising:

forming in a semiconductor substrate a trench from a back side of said semiconductor substrate;

forming at a top side of said semiconductor substrate a Metal Oxide Semiconductor Field Effect Transistor (MOSFET) having a source region and a drain region disposed in said semiconductor substrate;

forming a conductive line into said trench, said conductive line being electrically connected to said semiconductor substrate and aligned with said gate; and coupling said gate to said conductive line.

18. The method of claim 17, said MOSFET has a gate aligned with said trench.

19. The method of claim 17, said trench formed by etching.

20. The method of claim 17, further including filling said trench with trenchfill material.

21. The method of claim 17, said semiconductor substrate including Silicon On Insulator that includes a layer of oxide.

22. The method of claim 19, said etching stopped at said layer of oxide.

23. The method of claim 22, further including before forming a conductive line, removing said trenchfill material from said trench.

24. The method of claim 17, said forming of a conductive line in said trench includes filling said trench with a conductive material.

25. The method of claim 24, said conductive material is a metal.

26. The method of claim 25, further including forming a silicide material on sidewalls of said trench by combination between said metal and the semiconductor.

27. An active device comprising:

a Metal Oxide Semiconductor Field Effect Transistor (MOSFET) having a source region and a drain region disposed in a semiconductor substrate;

a conductive line in contact with said semiconductor substrate, said conductive line being aligned with, and coupled to, a gate of said MOSFET.

28. The active device of claim 27 said conductive line includes a metal.

29. The active device of claim 27 said conductive line includes a highly doped polysilicon material.

30. The active device of claim 27, including a via contact that couples a gate of said MOSFET to said conductive line.

* * * * *